(12) United States Patent
Song et al.

(10) Patent No.: US 10,084,023 B2
(45) Date of Patent: Sep. 25, 2018

(54) ORGANIC LIGHT-EMITTING DISPLAY APPARATUS

(71) Applicant: SAMSUNG DISPLAY CO., LTD., Yongin-si, Gyeonggi-do (KR)

(72) Inventors: Heerim Song, Yongin-si (KR); Ansu Lee, Yongin-si (KR); Chongchul Chai, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/470,087

(22) Filed: Mar. 27, 2017

(65) Prior Publication Data

US 2017/0278906 A1 Sep. 28, 2017

(30) Foreign Application Priority Data

Mar. 28, 2016 (KR) .................. 10-2016-0036957

(51) Int. Cl.
*H01L 27/32* (2006.01)

(52) U.S. Cl.
CPC ...... *H01L 27/3218* (2013.01); *H01L 27/3216* (2013.01); *H01L 27/3246* (2013.01); *H01L 27/3262* (2013.01)

(58) Field of Classification Search
CPC ............. H01L 27/3218; H01L 27/3262; H01L 27/3246; H01L 27/3216

USPC .......................................................... 257/40
See application file for complete search history.

(56) References Cited

U.S. PATENT DOCUMENTS

| 2009/0309813 | A1* | 12/2009 | Fujita | G02F 1/133512 |
| | | | | 345/55 |
| 2011/0175095 | A1 | 7/2011 | Kang et al. | |
| 2014/0070175 | A1* | 3/2014 | Kang | H01L 51/52 |
| | | | | 257/40 |

FOREIGN PATENT DOCUMENTS

| JP | 2006-276580 A | 10/2006 |
| KR | 10-2011-0130177 A | 12/2011 |
| KR | 10-2012-0004119 A | 1/2012 |
| KR | 10-2014-0079080 A | 6/2014 |

* cited by examiner

*Primary Examiner* — Fernando L Toledo
*Assistant Examiner* — Adam S Bowen
(74) *Attorney, Agent, or Firm* — Lee & Morse, P.C.

(57) ABSTRACT

An organic light-emitting display apparatus includes a substrate including a display area and a non-display area, a reference sub-pixel arranged on the display area to realize a first color, and a first sub-pixel arranged on the display area to realize the first color, the first sub-pixel being adjacent to the non-display area and having a shape different from a shape of the reference sub-pixel.

16 Claims, 5 Drawing Sheets

ORGANIC LIGHT-EMITTING DISPLAY APPARATUS

CROSS-REFERENCE TO RELATED APPLICATION

Korean Patent Application No. 10-2016-0036957, filed on Mar. 28, 2016, in the Korean Intellectual Property Office, and entitled: "Organic Light Emitting Display Apparatus," is incorporated by reference herein in its entirety.

BACKGROUND

1. Field

One or more embodiments relate to an organic light-emitting display apparatus.

2. Description of the Related Art

Organic light-emitting display apparatuses are self-emitting type display apparatuses that include an organic light-emitting diode (OLED) including a hole injection electrode, an electron injection electrode, and an organic emission layer between the hole injection electrode and electron injection electrode. In the OLED, excitons, which are generated by uniting holes injected from the hole injection electrode and electrons injected from the electron injection electrode in the organic emission layer, emit light by falling from an excited state to a ground state.

Organic light-emitting display apparatuses that are self-emitting type display apparatuses require no additional light sources, and thus, may be driven by a low voltage, and may be formed to be thin and lightweight. Also, organic light-emitting display apparatuses have excellent characteristics, such as wide viewing angles, high contrast, and rapid response rates. Thus, the scope of use thereof has been expanded to encompass personal mobile devices, such as MP3 players and cellular phones, as well as televisions. Recently, the organic light-emitting display apparatuses are not just limited to rectangular shapes, but may have various other shapes, such as circular shapes or oval shapes.

SUMMARY

According to one or more embodiments, an organic light-emitting display apparatus includes a substrate including a display area and a non-display area; a reference sub-pixel arranged on the display area and configured to realize a first color; and a first sub-pixel arranged on the display area to be adjacent to the non-display area and configured to realize the first color, wherein a shape of the first sub-pixel is different from a shape of the reference sub-pixel.

The first sub-pixel may include a first pixel electrode, and a pixel-defining layer including a first opening defining a first emission area on the first pixel electrode. The reference sub-pixel may include a reference pixel electrode, and a reference pixel-defining layer including a reference opening defining a reference emission area on the reference pixel electrode. A shape of the first opening may be different from a shape of the reference opening.

The pixel-defining layer and the reference pixel-defining layer may be integrally connected to each other and may include a same material.

The first sub-pixel may further include a first emission layer arranged in the first opening. The reference sub-pixel may further include a reference emission layer arranged in the reference opening. A shape of the first emission layer may be different from a shape of the reference emission layer.

An area of the first opening may be less than an area of the reference opening.

The first pixel electrode and the reference pixel electrode may have a same shape and a same area.

The organic light-emitting display apparatus may further include a boundary line between the display area and the non-display area, wherein at least a portion of the boundary line includes a curved line.

The boundary line may have a circular shape having a pre-determined curvature.

An edge of the first sub-pixel may include a curved line corresponding to the boundary line.

The organic light-emitting display apparatus may further include a plurality of second sub-pixels and a plurality of third sub-pixels arranged to be adjacent to the first sub-pixel and configured to realize a second color and a third color, respectively, wherein the first through third sub-pixels are included in one pixel.

Edges of at least one of the plurality of second sub-pixels and the plurality of third sub-pixels may include curved lines corresponding to the boundary line.

A shape of the first sub-pixel may be different from shapes of at least one of the plurality of second sub-pixels and the plurality of third sub-pixels.

The shapes of the at least one of the plurality of second sub-pixels and the plurality of third sub-pixels may be the same as the shape of the reference sub-pixel.

Each of the first through third sub-pixels may have a same area.

Respective shapes of the plurality of second sub-pixels and the plurality of third sub-pixels may be the same as the shape of the first sub-pixel.

The plurality of second sub-pixels may include a second pixel electrode, the plurality of third sub-pixels may include a third pixel electrode, and the pixel-defining layer may further include a second opening defining a second emission layer on the second pixel electrode and a third opening defining a third emission layer on the third pixel electrode.

Shapes of the second sub-pixel and the third sub-pixel may be the same as a shape of a first opening.

The plurality of second sub-pixels may further include the second emission layer arranged in the second opening, the plurality of third sub-pixels may further include the third emission layer arranged in the third opening, and shapes of the second emission layer and the third emission layer may be the same as a shape of a first emission layer.

The second pixel electrode and the third pixel electrode may have a same shape and a same area as the first pixel electrode.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
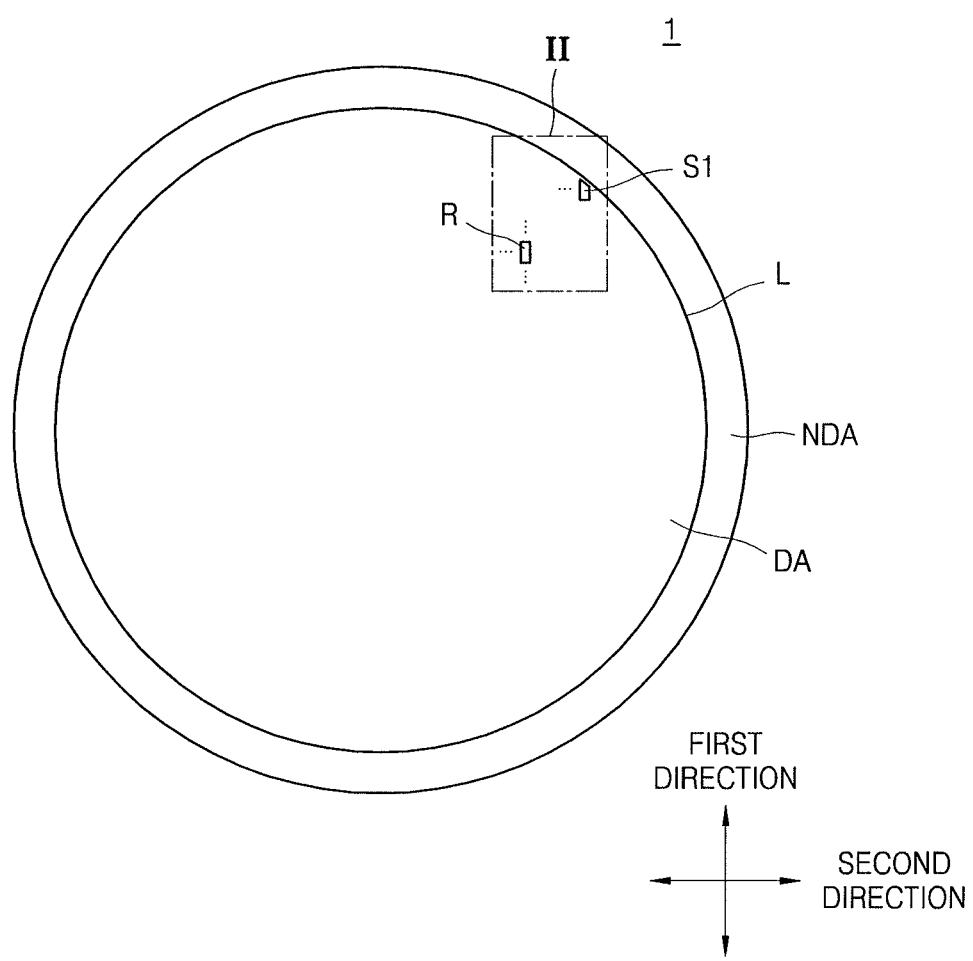
FIG. 1 illustrates a schematic plan view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

It will be understood that when an element, layer, or area is referred to as being "connected" to another element, layer, or area, it can be directly connected to the other element, layer, or area, or indirectly connected to the other element, layer, or area with other element, layer, or area being interposed therebetween. For example, when an element, layer, or area is referred to as being "electrically connected" to another element, layer, or area, it can be directly electrically connected to the other element, layer, or area, or indirectly electrically connected to the other element, layer, or area with other element, layer, or area being interposed therebetween.

Figure 2:
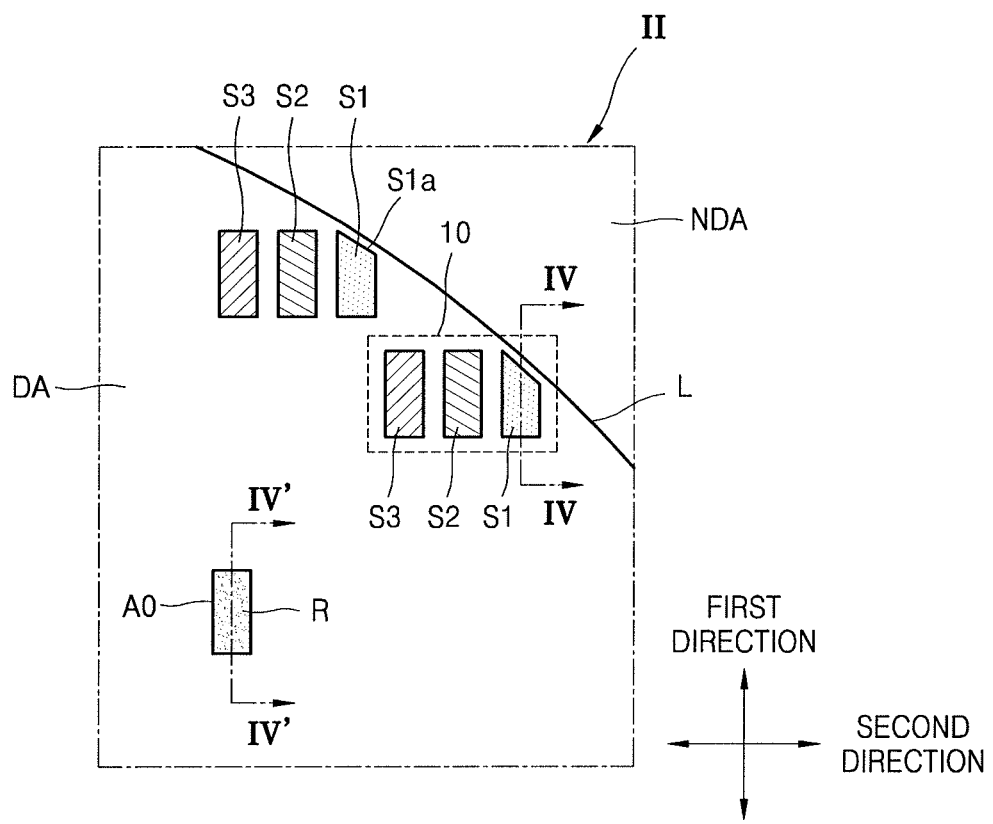
FIG. 2 illustrates an enlarged plan view of an area II of FIG. 1.

FIG. 1 is a schematic plan view of an organic light-emitting display apparatus 1 according to an embodiment, and FIG. 2 is an enlarged plan view of an area II of FIG. 1.

Referring to FIGS. 1 and 2, the organic light-emitting display apparatus 1 may include a display area DA for displaying an image and a non-display area NDA that is adjacent to the display area DA. The display area DA may include a plurality of pixels for emitting predetermined light. The organic light-emitting display apparatus 1 displays an image via the light emitted from the plurality of pixels included in the display area DA.

The non-display area NDA may, e.g., completely, surround an edge of the display area DA. The non-display area NDA may include a driving unit, e.g., a scan driving unit and a data driving unit, for transmitting predetermined signals to the plurality of pixels included in the display area DA.

At least a portion of a virtual boundary line L arranged between the display area DA and the non-display area NDA may be curved. For example, as illustrated in FIG. 1, the virtual boundary line L may have a circular structure having a predetermined curvature. However, the present disclosure is not limited thereto, and the virtual boundary line L may have various structures excluding a rectangular structure, e.g., the virtual boundary line L may have an oval structure or a structure of a rectangle that has a curvature only at an edge portion thereof.

For example, one or more virtual boundary lines L may be provided. That is, the organic light-emitting display apparatus 1 may have a shape of a disk that has a hole in the middle thereof, and may include a first virtual boundary line arranged at an edge of the display area DA and a second virtual boundary line arranged along the hole.

The organic light-emitting display apparatus 1 may include a plurality of first sub-pixels S1 and a plurality of reference sub-pixels R. The plurality of first sub-pixels S1 and the plurality of reference sub-pixels R may be defined as emission areas for emitting light.

The first sub-pixels S1 may be arranged on the display area DA to be adjacent to the non-display area NDA, and may realize a first color. The first color may be any one of blue, red, and green colors. According to another embodiment, the first color may be a white color. The organic light-emitting display apparatus 1 may further include a plurality of second sub-pixels S2 and a plurality of third sub-pixels S3 arranged on the display area DA to be adjacent to the first sub-pixels S1 and realizing a second color and a third color, respectively. The first sub-pixels S1, the second sub-pixels S2, and the third sub-pixels S3 may realize different colors among blue, green, and red, and may be included in one pixel 10 (FIG. 2). The pixel 10 may have a pentile matrix structure including a white color in addition to blue, red, and green colors.

The reference sub-pixels R may be sub-pixels realizing the same first color as the first sub-pixels S1 and may be arranged on the display area DA to be apart from the non-display area NDA. In the case of a reference pixel including the reference sub-pixels R arranged to be apart from the non-display area NDA, sub-pixels realizing first, second, and third colors may have the same shape and area. Thus, the reference sub-pixels R may not necessarily have to be the sub-pixels realizing the first color. However, for convenience of description, the sub-pixels realizing the same first color as the first sub-pixels S1 will be defined as the reference sub-pixels R.

Referring to FIG. 2, the shapes and the areas of the second sub-pixels S2, third sub-pixels S3, and reference pixels R may be the same. However, a shape and an area of the first sub-pixel S1 may be different from those of the reference sub-pixel R. In other words, while the first sub-pixel S1 and the reference sub-pixel R emit a same color, their respective shapes and areas are different in accordance with their position within the display area DA.

In detail, an edge S1a of the first sub-pixel S1, i.e., the edge adjacent to the virtual boundary line L, may include a curved line corresponding, e.g., parallel, to the virtual boundary line L. For example, as illustrated in FIG. 2, each of the first sub-pixel S1 may include an edge that, e.g., directly, faces and extends along a profile of the virtual boundary line L, e.g., a side of the first sub-pixel S1 that directly faces the virtual boundary line L may have a same curvature as a portion of the virtual boundary line L it overlaps. Also, the area of the first sub-pixel S1 may be less than an area of the reference sub-pixel R, i.e., because of the adjusted shape of the edge S1a. The plurality of first sub-pixels S1 may be arranged along the virtual boundary line L. Here, each of the plurality of first sub-pixels S1 may include an edge with the same shape as the virtual boundary line L adjacent thereto, e.g., each of the plurality of first sub-pixels S1 may have a different edge facing the virtual boundary line L relative to an adjacent first sub-pixels S1 in accordance with a curvature of a portion of the virtual boundary line L adjacent thereto.

If the sub-pixels adjacent to the non-display area NDA were to have the same shape and area as the reference sub-pixel R, the sub-pixels adjacent to the non-display area NDA would have been arranged to at least partially extend into the non-display area NDA, i.e., an edge of such sub-pixels would have extended beyond the virtual boundary line L to overlap the non-display area NDA. In this case, the edge of the display area DA, which is intended to be circular, may have an aliasing phenomenon whereby the edge is unevenly visible due to these sub-pixels.

In contrast, the organic light-emitting display apparatus 1 according to an embodiment includes the first sub-pixels S1 with edges adjacent to the non-display area NDA that have the same shape as the virtual boundary line L. Therefore, the first sub-pixels S1 do not extend into or overlap the non-display area NDA, thereby preventing or substantially minimizing the aliasing phenomenon.

Figure 3A:
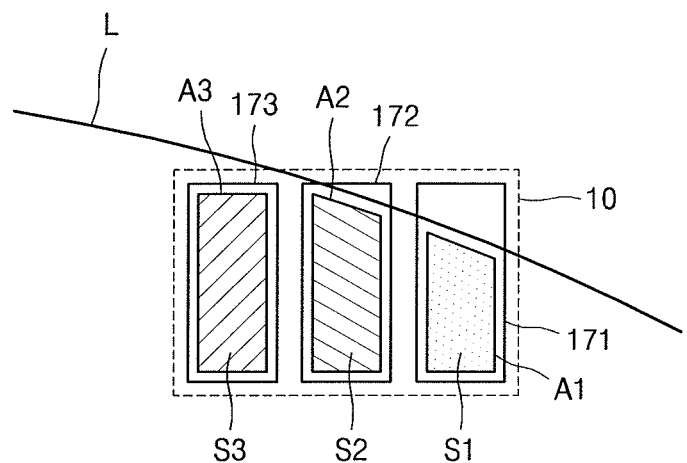
FIGS. 3A and 3B illustrate views of a pixel of FIG. 2, according to other embodiments.
Figure 3B:
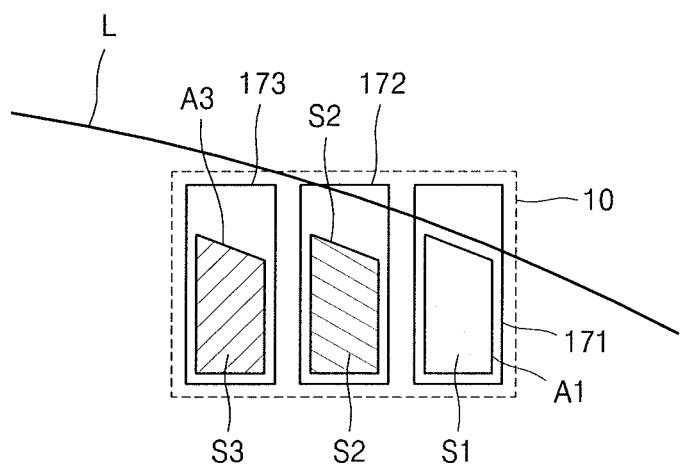

FIGS. 3A and 3B show the pixel 10 of FIG. 2, according to other embodiments.

Referring to FIG. 3A, the pixel 10 adjacent to the non-display area NDA may include not only the first sub-pixel S1, but also the second sub-pixel S2 or the third sub-pixel S3 with an edge adjacent to the non-display area NDA. An edge of the second sub-pixel S2 or the third sub-pixel S3 that is adjacent to the non-display area NDA, i.e., an edge adjacent to and facing the virtual boundary line L, may include a curved line corresponding, e.g., parallel, to the virtual boundary line L, like the edge of the first sub-pixel S1. For example, as illustrated in FIG. 3A, as the first and second sub-pixels S1 and S2 are positioned differently relatively to the virtual boundary line L, the shape, e.g., angle, of the edges of the first and second sub-pixels S1 and S2 may be different from each other.

Here, the shape of the first sub-pixel S1 may be different from at least one of a shape of the second sub-pixel S2 and a shape of the third sub-pixel S3. As illustrated in FIG. 3A, the first through third sub-pixels S1 through S3 may have different shapes. An organic light-emitting display apparatus has an increased life span, when an organic emission layer thereof has an increased area. Thus, when the second sub-pixel S2 or the third sub-pixel S3 has the same area as the reference sub-pixel R, which has a greater area than the first sub-pixel S1, the lifespan of the pixel 10 may be maximized.

Referring to FIG. 3B, according to another embodiment, the first sub-pixel S1, the second sub-pixel S2, and the third sub-pixel S3 may have the same area. In the case of a reference pixel including the reference sub-pixels R, sub-pixels realizing first through third colors have the same area. On the contrary, the first sub-pixel S1, the second sub-pixel S2, and the third sub-pixel S3 illustrated in FIG. 3A have different areas, and thus, chromatic deviation may occur between the reference sub-pixel R and the pixel 10. Accordingly, when the first through third sub-pixels S1 through S3 have the same area, chromatic deviation may be minimized. Here, the second sub-pixel S2 and the third sub-pixel S3 may have the same shape as the first sub-pixel S1.

Figure 4:
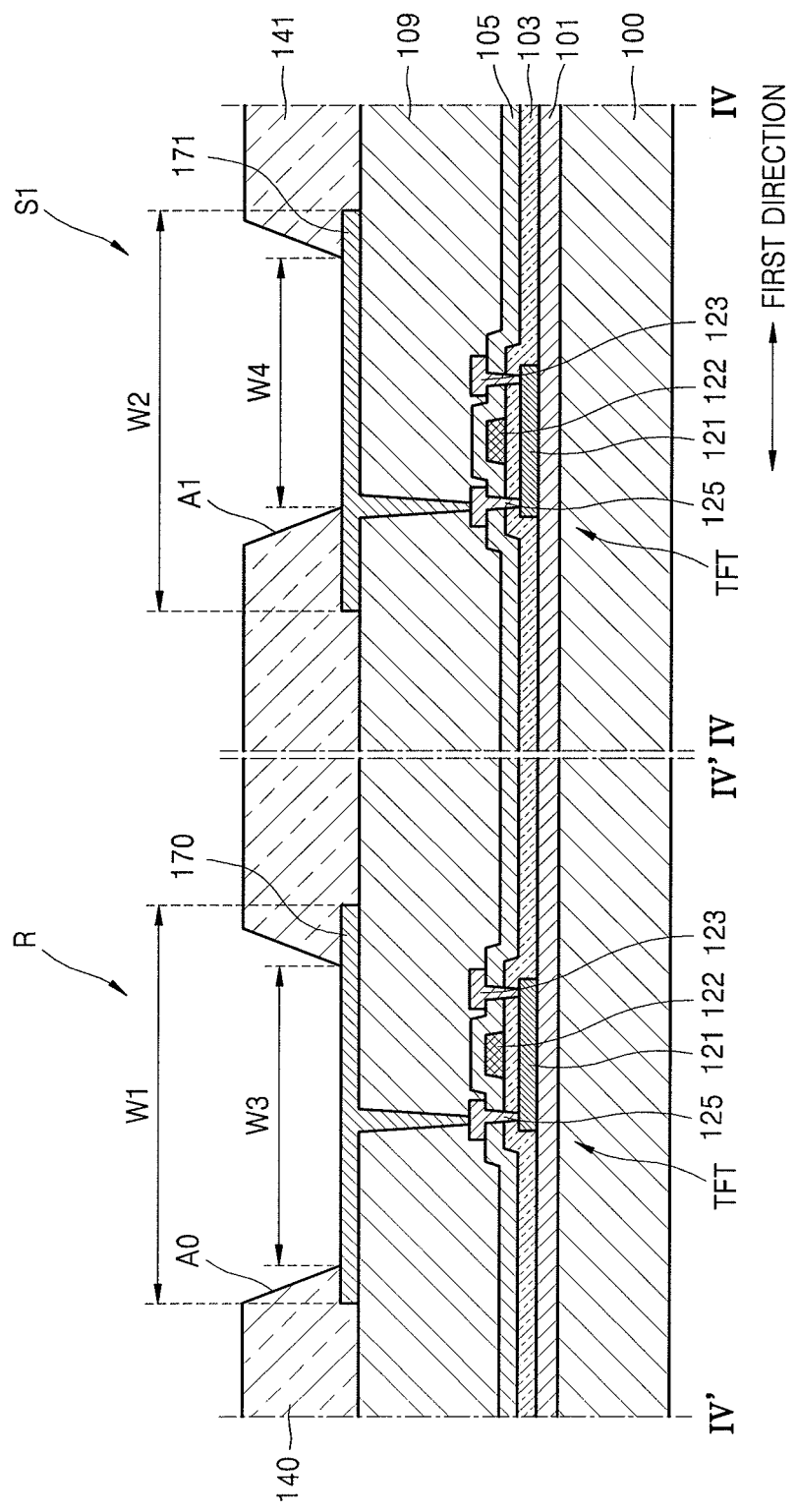
FIGS. 4 and 5 illustrate cross-sectional views taken along lines IV-IV and IV'-IV' of FIG. 2.
Figure 5:
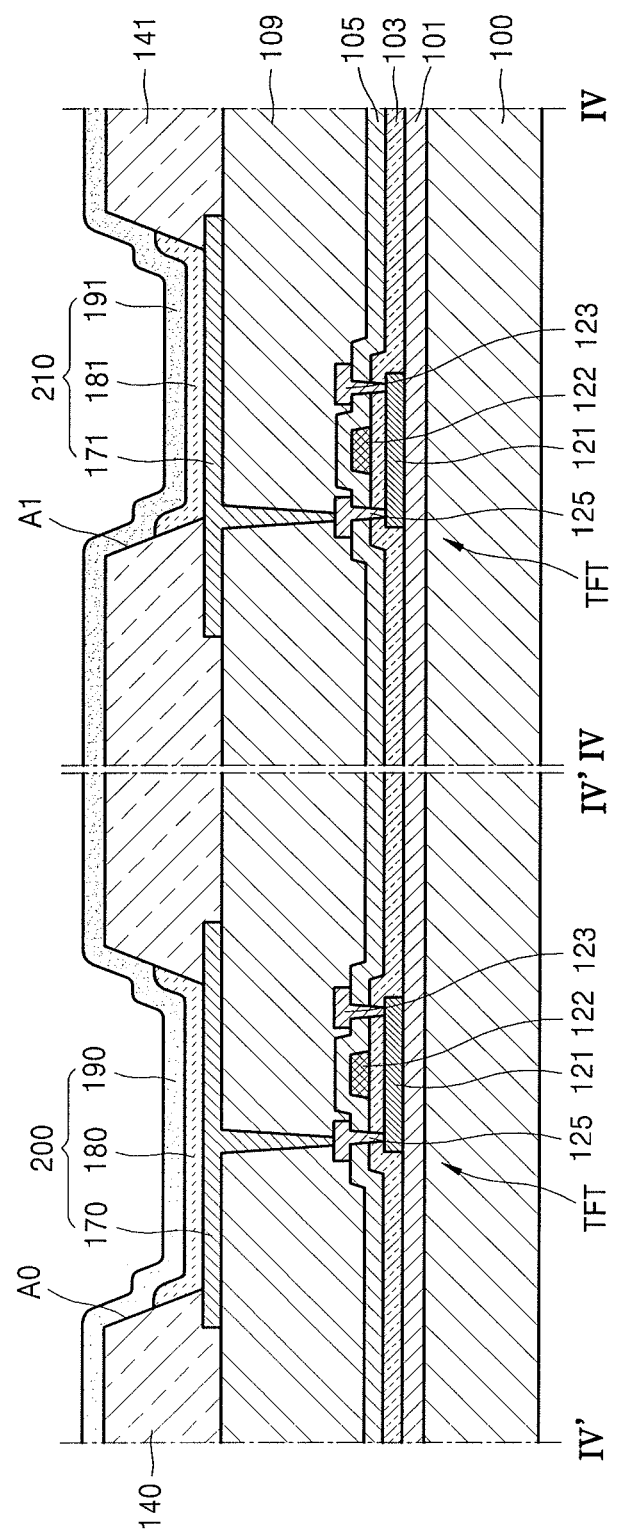

FIGS. 4 and 5 are cross-sectional views taken along lines IV-IV and IV'-IV' of FIG. 2.

Referring to FIGS. 4 and 5, the organic light-emitting display apparatus 1 according to an embodiment may include a substrate 100, the first sub-pixel S1, and the reference sub-pixel R.

Each of the first sub-pixel S1 and the reference sub-pixel R may include a thin film transistor TFT arranged on the substrate 100, and a via-insulating layer 109 covering the thin film transistor TFT. The substrates 100, the thin film transistors TFT, and the via-insulating layers 109 of the first sub-pixel S1 and the reference sub-pixel R have the same structures and materials, and thus, they will be referred to by the same reference numerals.

The first sub-pixel S1 may include a first pixel electrode 171 electrically connected to the thin film transistor TFT, and a pixel-defining layer 141 including a first opening A1 defining a first emission area on the first pixel electrode 171. Also, as illustrated in FIG. 5, the first sub-pixel S1 may further include a first emission layer 181 arranged in the first opening A1.

The reference sub-pixel R may include a reference pixel electrode 170 electrically connected to the thin film transistor TFT, and a reference pixel-defining layer 140 including a reference opening A0 defining a reference emission layer on the reference pixel electrode 170. Also, the reference sub-pixel R may further include a reference emission layer 180 arranged in the reference opening A0.

The substrate 100 may include not only a glass substrate, but also a plastic substrate including polyethylene terephthalate (PET), polyethylene naphthalate (PEN), polyimide, etc. According to an embodiment, the substrate 100 may include a flexible substrate. Here, the flexible substrate 100 refers to a substrate that is easily bent, curved, folded, or rolled. The flexible substrate 100 may include ultrathin glass, metal or plastic.

A buffer layer 101 may further be provided on the substrate 100 to planarize the substrate 100 and prevent impure elements from penetrating through the substrate 100. The buffer layer 101 may be formed as a single layer or multiple layers including silicon nitride and/or silicon oxide. The thin film transistor TFT may be arranged on the display area DA of the buffer layer 101. A barrier layer may further be arranged between the substrate 100 and the buffer layer 101. The buffer layer 101 may be omitted as necessary.

The thin film transistor TFT may function as part of a driving circuit unit for driving the organic light-emitting device OLED. The driving circuit unit may further include a capacitor, a wire, etc., in addition to the thin film transistor TFT.

The thin film transistor TFT may include an active layer 121 arranged on the buffer layer 101, a gate electrode 122 arranged on at least a portion of the active layer 121, a source electrode 123 to which a data signal is applied, and a drain electrode 125 electrically connected to the pixel electrode 171. A gate insulating layer 103 may be arranged between the active layer 121 and the gate electrode 122, and an interlayer insulating layer 105 may be arranged between the gate electrode 122, and the source electrode 123 and the drain electrode 125.

The active layer 121 may include a semiconductor material. For example, the active layer 121 may include amorphous silicon or polycrystalline silicon. However, embodiments are not limited thereto. According to another embodiment, the active layer 121 may include an organic semiconductor material or an oxide semiconductor material.

The gate electrode 122 may be connected to a gate wire (not shown) applying an on/off signal to the thin film transistor TFT, and may include a low resistance metal material. For example, the gate electrode 122 may be formed as a single layer or multiple layers by using at least one metal selected from Al, Pt, Pd, Ag, Mg, Au, Ni, Nd, Ir, Cr, Li, Ca, Mo, Ti, W, and Cu.

The source electrode 123 and the drain electrode 125 may be a single layer or multiple layers including a conductive material having high conductivity, and may be connected to a source area and a drain area of the active layer 121, respectively. For example, the source electrode 123 and the drain electrode 125 may be formed as a single layer or multiple layers by using at least one metal selected from Al, Pt, Pd, Ag, Mg, Au, Ni, Nd, Ir, Cr, Li, Ca, Mo, Ti, W, and Cu.

According to an embodiment, the thin film transistor TFT may be a top gate type in which the gate electrode 122 is disposed on the active layer 121. However, embodiments are not limited thereto. According to another embodiment, the thin film transistor TFT may be a bottom gate type in which the gate electrode 122 is disposed below the active layer 121.

The gate insulating layer 103 and the interlayer insulating layer 105 may be a single layer or multiple layers including an inorganic material. For example, the gate insulating layer 103 and the interlayer insulating layer 105 may include $SiO_2$, $SiN_x$, SiON, $Al_2O_3$, $TiO_2$, $Ta_2O_5$, $HfO_2$, and/or $ZrO_2$.

The buffer layer 101, the gate insulating layer 103, and the interlayer insulating layer 105 may extend to a portion of the peripheral area PA beyond the display area DA. According to an embodiment, the buffer layer 101, the gate insluting layer 103, and the interlayer insulating layer 105 may be arranged on areas of the substrate 100, except an outermost edge area.

The via-insulating layer 109 may cover the thin film transistor TFT, and remove a step difference due to the thin film transistor TFT, etc. and planarize an upper surface of the thin film transistor TFT. The via-insulating layer 109 may be a single layer or multiple layers including an organic material. However, embodiments are not limited thereto, and the via-insulating layer 109 according to another embodiment may be a combined stack of an inorganic insulating layer and an organic insulating layer.

The first pixel electrode 171 or the reference pixel electrode 170 may be arranged on the via-insulating layer 109 and electrically connected to the thin film transistor TFT via a via-hole VIA included in the via-insulating layer 109. The first pixel electrode 171 and the reference pixel electrode 170 according to an embodiment are electrically connected to the drain electrode 125. However, embodiments are not limited thereto. The first pixel electrode 171 and the reference pixel electrode 170 according to another embodiment may be electrically connected to the source electrode 123.

The first pixel electrode 171 and the reference pixel electrode 170 may be formed by using a material having a high work function. In the case of a bottom emission type in which an image is displayed toward a bottom portion of the substrate 100, the first pixel electrode 171 and the reference pixel electrode 170 may include at least one transparent conductive oxide selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

According to another embodiment, in the case of a top emission type in which an image is displayed toward a first opposite electrode 191 or a reference opposite electrode 190, the first pixel electrode 171 and the reference pixel electrode 170 may further include a metal reflective layer including Ag, Mg, Al, Pt, Pd, Au, Ni, Nd, Ir, Cr, or the like, in addition to the transparent conductive oxide.

The reference pixel-defining layer 140 and the pixel-defining layer 141 may be integrally connected, e.g., may constitute a same layer, and may include the same material. The reference pixel-defining layer 140 and the pixel-defining layer 141 may be photosensitive organic layers. For example, the reference pixel-defining layer 140 and the pixel-defining layer 141 may include PI. The pixel-defining layer 141 may cover an edge of the first pixel electrode 171, and may include the first opening A1 defining the first emission area of the first pixel electrode 171. The reference pixel-defining layer 140 may cover an edge of the reference pixel electrode 170 and may include the reference opening A0 defining the reference emission area of the reference pixel electrode 170.

Referring to FIGS. 2 and 3A again, a shape of the first opening A1 may be different from a shape of the reference opening A0. A shape of the first sub-pixel S1 may be defined by the first opening A1 of the pixel-defining layer 141. The shape of the first opening A1 may be different from the shape of the reference opening A0, and as described above, the shape of the first sub-pixel S1 may be different from a shape of the reference sub-pixel R. In this case, the first pixel electrode 171 may have the same shape and area as the reference pixel electrode 170. That is, the first sub-pixel S1 and the reference sub-pixel R having different shapes from each other may be formed on the first pixel electrode 171 and the reference pixel electrode 170 having the same shape as each other, by using the pixel-defining layer 141 and the reference pixel-defining layer 140 having the openings A1 and A0 having the different shapes.

In detail, since the first pixel electrode 171 and the reference pixel electrode 170 have the same shape and area, a width W2 of the first pixel electrode 171 arranged in a first direction may be the same as a width W1 of the reference pixel electrode 170. On the contrary, a width W4 of the first opening A1 may be less than a width W3 of the reference opening A0. An edge of the first opening A1, i.e., the edge adjacent to the boundary line L, may have the same shape as the boundary line L, and thus, the width W4 of the first opening A1 may vary along a second direction (refer to FIG. 2) that is perpendicular to the first direction.

Referring to FIG. 3A or 3B again, the second sub-pixel S2 may include a second pixel electrode 172, and the third sub-pixel S3 may include a third pixel electrode 173. Here, the pixel-defining layer 141 may further include a second opening A2 defining a second emission area on the second pixel electrode 172 and a third opening A3 defining a third emission area on the third pixel electrode 173. According to an embodiment, to minimize chromatic deviation, when the second sub-pixel S2 and the third sub-pixel S3 have the same shape as the first sub-pixel S1, the second opening A2 and the third opening A3 may have the same shape as the first opening A1. Here, the second pixel electrode 172 and the third pixel electrode 173 may have the same shape and area as the first pixel electrode 171 and the reference pixel electrode 170.

Referring to FIG. 5, the first sub-pixel S1 may further include the first emission layer 181 arranged in the first opening A1, and the reference sub-pixel R may further include the reference emission layer 180 arranged in the reference opening A0. The shape of the first emission layer 181 may correspond to the shape of the first opening A1, and the shape of the reference emission layer 180 may correspond to the shape of the reference opening A0. Also, the second sub-pixel S2 and the third sub-pixel S3 may further include a second emission layer and a third emission layer having shapes corresponding to the shapes of the second opening A2 and the third opening A3, respectively. The first emission layer 181 and the reference emission layer 180 may have different shapes, but may include the same material. Thus, for convenience of description, descriptions will be made based on the first emission layer 181.

The first emission layer 181 may include an organic material including a fluorescent or phosphorescent material emitting light of a first color. According to another embodiment, although not shown, the organic light-emitting display apparatus 1 may include at least one of a first function layer interposed between the first emission layer 181 and the first pixel electrode 171 and a second function layer interposed between the first emission layer 181 and the opposite electrode 191.

The first function layer may include at least one of a hole injection layer HIL and a hole transport layer HTL. The hole injection layer HIL may make holes be easily emitted from an anode, and the hole transport layer HTL may make holes of the hole injection layer be transported to the emission layer.

The hole injection layer HIL may include, but is not limited to, a phthalocyanine compound, such as copper phthalocyanine, etc., DNTPD (N,N'-diphenyl-N,N'-bis-[4-(phenyl-m-tolyl-amino)-phenyl]-biphenyl-4,4'-diamine), m-MTDATA (4,4',4"-tris(3-methylphenylphenylamino) triphenylamine), TDATA (4,4'4"-Tris(N,N-diphenylamino)triphenylamine), 2T-NATA (4,4',4"-tris{N,-(2-naphthyl)-N-phenylamino}-triphenylamine), PEDOT/PSS (Poly(3,4-ethylenedioxythiophene)/Poly(4-styrenesulfonate)), Pani/DBSA (Polyaniline/Dodecylbenzenesulfonic acid), Pani/CSA (Polyaniline/Camphor sulfonicacid), or PANI/PSS (Polyaniline)/Poly(4-styrenesulfonate).

The hole transport layer HTL may include, but is not limited to, carbazole derivatives, such as N-phenylcarbazole and polyvinylcarbazole, or triphenylamine-based materials, such as TPD (N,N'-bis(3-methylphenyl)-N,N'-diphenyl-[1,1-biphenyl]-4,4'-diamine), NPB (N,N'-di(1-naphthyl)-N,N'-diphenylbenzidine), TCTA (4,4',4"-tris(N-carbazolyl)triphenylamine).

The second function layer may include at least one of the electron transport layer ETL and an electron injection layer EIL. The electron injection layer EIL may make electrons be easily emitted from a cathode, and the electron transport layer ETL may make electrons of the electron injection layer EIL be transported to the emission layer.

The electron transport layer ETL may include, but is not limited to, Alq3, BCP (2,9-Dimethyl-4,7-diphenyl-1,10-phenanthroline), Bphen (4,7-Diphenyl-1,10-phenanthroline), TAZ (3-(4-Biphenylyl)-4-phenyl-5-tert-butylphenyl-1,2,4-triazole), NTAZ (4-(Naphthalen-1-yl)-3,5-diphenyl-4H-1,2,4-triazole), tBu-PBD (2-(4-Biphenylyl)-5-(4-tert-butylphenyl)-1,3,4-oxadiazole), BAlq (Bis(2-methyl-8-quinolinolato-N1,O8)-(1,1'-Biphenyl-4-olato)aluminum), Bebq2 (beryllium bis(benzoquinolin-10-olate), or ADN (9,10-di(naphthalene-2-yl)anthrascene).

The electron injection layer EIL may include, but is not limited to, LiF, NaCl, CsF, Li2O, BaO, or Liq.

The first emission layer 181 may be arranged at each organic light-emitting device 210, and in this case, the organic light-emitting device 210 may emit light of a first color, which includes any one of a red color, a green color, and a blue color, according to a type of the first emission layer 181 included in the organic light-emitting device 210. However, embodiments are not limited thereto, and a plurality of emission layers may be arranged in one organic light-emitting device 210. For example, the plurality of emission layers emitting light of red, green, and blue colors may be vertically stacked or combined to emit light of a white color. In this case, a color conversion layer or a color filter may further be provided to convert the emitted white light into a predetermined color. The red, green, and blue colors are examples, and a combination of colors for emitting light of a white color is not limited thereto.

The opposite electrode 191 may be arranged on the first emission layer 181, and the opposite electrode 191 may include various conductive materials. For example, the opposite electrode 191 may include at least one selected from the group consisting of Li, Ca, LiF, Al, Mg, and Ag, and may be formed as a single layer or multiple layers. In the case of a bottom-emission type, the opposite electrode 191 may be a reflection electrode, and in the case of a top-emission type, the opposite electrode 191 may be a conductive electrode having a transmissive material.

By way of summation and review, organic light-emitting display apparatuses may have pixels arranged at an outer portion of a curved display area, thereby being visible. In contrast, one or more embodiments include an organic light-emitting display apparatus having no visible pixels at an outer portion of the display area.

That is, as described above, according to the one or more of the above embodiments, in the organic light-emitting display apparatus 1, sub-pixels that are directly adjacent to the display area DA (which may have various shapes other than a quadrangular shape), have shapes different than shapes of reference sub-pixels arranged in the center of the display area DA. Thus, aliasing, whereby a boundary of the display area DA is unevenly visible, may be removed. Also, the organic light-emitting display apparatus 1 may be manufactured by changing only a design of one photomask used for a pixel-defining layer. Thus, the manufacturing costs may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
    a substrate including a display area and a non-display area;
    a reference sub-pixel arranged on the display area to realize a first color; and
    a first sub-pixel arranged on the display area to realize the first color, the first sub-pixel being adjacent to the non-display area and having a shape different from a shape of the reference sub-pixel, wherein the first sub-pixel includes:
- a first pixel electrode;
- a pixel-defining layer on the first pixel electrode, the pixel-defining layer including a first opening defining a first emission area on the first pixel electrode; and
- a first emission layer in the first opening, and wherein the reference sub-pixel includes:
- a reference pixel electrode, the reference pixel electrode having a same shape and a same size as the first pixel electrode;
- a reference pixel-defining layer on the reference pixel electrode, the reference pixel-defining layer including a reference opening defining a reference emission area on the reference pixel electrode, and a shape and a size of the first opening being different from a shape and a size of the reference opening; and
- a reference emission layer in the reference opening, a shape and a size of the first emission layer being different from a shape and a size of the reference emission layer.

2. The organic light-emitting display apparatus as claimed in claim 1, wherein the pixel-defining layer and the reference pixel-defining layer are integrally connected to each other and include a same material.

3. The organic light-emitting display apparatus as claimed in claim 1, wherein an area of the first opening is less than an area of the reference opening.

4. The organic light-emitting display apparatus as claimed in claim 1, further comprising a boundary line between the display area and the non-display area, at least a portion of the boundary line including a curved line, and the first opening and the reference opening defining the different shapes of the first sub-pixel and the reference sub-pixel.

5. The organic light-emitting display apparatus as claimed in claim 4, wherein the boundary line has a circular shape having a pre-determined curvature.

6. The organic light-emitting display apparatus as claimed in claim 4, wherein an edge of the first sub-pixel includes a curved line corresponding to the boundary line.

7. The organic light-emitting display apparatus as claimed in claim 6, further comprising a plurality of second sub-pixels and a plurality of third sub-pixels arranged to be adjacent to the first sub-pixel and to realize a second color and a third color, respectively, the first through third sub-pixels defining one pixel.

8. The organic light-emitting display apparatus as claimed in claim 7, wherein edges of at least one of the plurality of second sub-pixels and the plurality of third sub-pixels include curved lines corresponding to the boundary line.

9. The organic light-emitting display apparatus as claimed in claim 7, wherein a shape of the first sub-pixel is different from shapes of at least one of the plurality of second sub-pixels and the plurality of third sub-pixels.

10. The organic light-emitting display apparatus as claimed in claim 9, wherein the shapes of the at least one of the plurality of second sub-pixels and the plurality of third sub-pixels are the same as the shape of the reference sub-pixel.

11. The organic light-emitting display apparatus as claimed in claim 7, wherein each of the first through third sub-pixels have a same area.

12. The organic light-emitting display apparatus as claimed in claim 11, wherein respective shapes of the plurality of second sub-pixels and the plurality of third sub-pixels are the same as the shape of the first sub-pixel.

13. The organic light-emitting display apparatus as claimed in claim 7, wherein:
- the plurality of second sub-pixels include a second pixel electrode,
- the plurality of third sub-pixels include a third pixel electrode, and
- the pixel-defining layer further includes a second opening defining a second emission layer on the second pixel electrode and a third opening defining a third emission layer on the third pixel electrode.

14. The organic light-emitting display apparatus as claimed in claim 13, wherein shapes of the second sub-pixel and the third sub-pixel are the same as a shape of a first opening.

15. The organic light-emitting display apparatus as claimed in claim 13, wherein:
- the plurality of second sub-pixels further include the second emission layer arranged in the second opening,
- the plurality of third sub-pixels further include the third emission layer arranged in the third opening,
- and shapes of the second emission layer and the third emission layer are the same as a shape of a first emission layer.

16. The organic light-emitting display apparatus as claimed in claim 13, wherein the second pixel electrode and the third pixel electrode have a same shape and a same area as the first pixel electrode.

* * * * *